United States Patent [19]

Gotoh et al.

[11] Patent Number: 5,179,601
[45] Date of Patent: Jan. 12, 1993

[54] METHOD OF MANUFACTURING CIRCUIT STRUCTURE BY INSERT MOLDING OF ELECTRIC AND/OR OPTICAL TRANSMISSION MEDIUM

[75] Inventors: Masao Gotoh, Yokosuka; Makoto Iida, Kawasaki; Kenichi Waragai, Fujisawa; Yonezo Yanokura, Katsuta; Masaki Sato, Yokohama, all of Japan

[73] Assignee: Hitachi, Ltd., Tokyo, Japan

[21] Appl. No.: 785,000

[22] Filed: Oct. 30, 1991

Related U.S. Application Data

[62] Division of Ser. No. 583,113, Jun. 14, 1990, Pat. No. 5,071,223.

[30] Foreign Application Priority Data

Jun. 16, 1989 [JP] Japan .................. 1-152316

[51] Int. Cl.⁵ .................. G02B 6/12; G02B 6/26
[52] U.S. Cl. .................................................. 385/14
[58] Field of Search .................................. 385/14

[56] References Cited

U.S. PATENT DOCUMENTS

| | | | |
|---|---|---|---|
| 4,693,543 | 9/1987 | Matsumura et al. | 350/96.11 |
| 4,695,120 | 9/1987 | Holder | 350/96.14 |
| 4,714,312 | 12/1987 | Thaniyavarn | 350/96.15 |
| 4,750,799 | 6/1988 | Kawachi et al. | 350/96.11 |
| 4,758,063 | 7/1988 | Konechny, Jr. | 350/96.2 |
| 4,953,933 | 9/1990 | Asmar | 350/96.11 |
| 5,071,223 | 12/1991 | Gotoh et al. | 385/14 |

FOREIGN PATENT DOCUMENTS

| | | |
|---|---|---|
| 178579 | 4/1986 | European Pat. Off. . |
| 0272027 | 6/1988 | European Pat. Off. . |
| 2134440 | 8/1972 | France . |
| 1124765 | 4/1986 | France . |
| 2638594 | 5/1990 | France . |
| 58-180095 | 10/1983 | Japan . |

OTHER PUBLICATIONS

Mizuishi, K., Patent Abstracts of Japan, vol. 12, No. 48, Feb. 13, 1988, p. 666, "Optical Fiber Supporting Device", English Language Abstract of JP-A-62196607, Aug. 31, 1987.

IBM Technical Disclosure Bulletin, vol. 28, No. 8, Jan. 1986, "Circuit Boards with Light Distribution Layers", pp. 3532-3534.

*Primary Examiner*—Akm E. Ullah
*Attorney, Agent, or Firm*—Kenyon & Kenyon

[57] ABSTRACT

A method of manufacturing a circuit structure where the electric and/or optical transmission medium or media include at least one of an optical signal transmission medium, an electric signal transmission medium, and an electric power transmission medium. The transmission media are insert-molded in plastics which is a housing for electronic and electric devices and parts. The circuit structure serves both for conductive circuits and housing so that the electronic and electric devices and parts can be wired and mounted at high density.

7 Claims, 3 Drawing Sheets

METHOD OF MANUFACTURING CIRCUIT STRUCTURE BY INSERT MOLDING OF ELECTRIC AND/OR OPTICAL TRANSMISSION MEDIUM

This is a divisional application of U.S. patent application Ser. No. 07/583,113 filed on Jun. 14, 1990, now U.S. Pat. No. 5,071,223 issued on Dec. 10, 1991.

BACKGROUND OF THE INVENTION

The present invention relates to a circuit structure formed by insert-molding of electric and/or optical transmission medium in plastics. More particularly, it relates to a circuit structure wherein electronic devices can be wired and mounted at high density.

In the conventional electronic and electric devices, electric control signal transmission wiring and electric power transmission wiring are complicated. These are large obstacles to fulfilling the strong deuris for reduction of assembling process steps, high level functions, and miniaturization. They have been problems that cannot be solved in the conventional technology.

On the other hand, there have been many disclosures about manufacturing methods of conductive circuit boards, including a two shot molding method, a photo-additive method and a subtraction method using plating, a printed circuit transfer method, a circuit printed film fusion mapping method, etc. However, these methods have a great number of processing steps, and disadvantages in heat resistance characteristics, and long-term reliability, and therefore have not developed into practical use yet.

There is Japanese Patent Laid-Open 58-180095, there is discloses a structure and a method in which a printed-circuit board and cables are buried in plastics, and the structure is a housing in which the usual structure having usual electronic devices and parts implemented is fixed by plastics. However, this structure is insufficient in miniaturization and in reliability for such characteristics as heat resistance and thermal shock resistance.

SUMMARY OF THE INVENTION

The present invention overcomes the difficulties mentioned above and provides a circuit structure, wherein a conductive circuit module having an electric and/or optical transmission medium molded to integrate in plastics and/or the transmission medium are insert-molded preferably in material of a housing for electronic and electric devices preferably to serve both as conductive circuit and housing so that the electronic and electric devices and parts can be wired and mounted at high density.

Other objects of the invention will be obvious from the contents of the specification herein after disclosed.

The circuit structure according to the present invention is made up in a way that an electric and/or optical transmission medium and an electric power transmission medium are insert-molded to integrate in plastics. It also can be made up to serve as housing.

A known optical fiber of glass or organic high molecular material may be used as the optical signal transmission medium.

An electric wire or lead frame of thin metal plate may be used as the electric signal transmission medium. The lead frame of thin metal plate can be obtained in a way that a thin plate of copper system, iron system, aluminum system, or superconductor material of around 0.01 to 1.0 mm thick is processed to a slitlike shape having predetermined line width and pitch so that it has a two-dimensional or three-dimensional structure. A signal current flowing in the electric signal transmission medium is usually 8 to 50 mA. A lead frame of thin metal plate thinner than 0.01 mm is undesirably difficult to form without harmful deformation. For up to 50 mA of the current, the thickness of the lead frame of thin metal plate is sufficient to be 1 mm. Even if the thickness is made thicker than 1 mm, it will not generally provide a special advantage.

An electric power wire or lead frame of thick metal plate is used the electric power transmission medium. The lead frame of thick metal plate can be obtained in a way that a thick plate of copper system or aluminum system material of around 0.5 to 3 mm thick is processed to a two-dimensional or three-dimensional structure having a rectangular, elliptic, or similar cross-section. A current flowing in the electric power transmission medium is usually 4 to 600 A. It is not preferable to make the lead frame of thick metal plate thinner than 0.5 mm as it is not sufficient to make the 4 A current flow. For up to 600 A of the current, the thickness of the lead frame of thick metal plate is sufficient to be 3 mm. Even if the thickness is made thicker than 3 mm, it will not generally provide a special advantage.

For the electric signal lead frame and the electric power lead frame, in general, the above-mentioned materials may be used. However it is not necessary to limit these materials thereto.

A high heat resistant thermosetting resin and engineering plastics of thermoplastic resin and super engineering plastics having very high heat resistance can be used for the molding resin materials.

The molding method used is a new process to obtain the circuit structure uniting the conductive circuits, in a way that (1) a three-dimensional transmission medium or media having at least one or two different kinds of media are put in a mold, (2) parts of or whole transmission media are transfer-molded and shaped and fixed or insulation covered at a low pressure, and (3) the high heat resistant thermoplastic resin is made low in viscosity and is injection-molded with the mold cavity.

While the thickness of the circuit structure according to the present invention has been generally 1 to 3 mm, it should be understood that it is not limited thereto.

The molding machine used is an integrated transfer and injection molding machine prepared for use with the present invention as shown in FIG. 4.

The thermosetting resin to be used in the transfer molding is generally an epoxy resin containing silica. It can be replaced by an alternative phenol resin, diallyl phthalate resin, or similar filler composite thermosetting resins.

The size of the silica filler is usually around 10 to 100 μm, and its content is 30 to 70 wt %. The silica can be alternatively replaced by glass fiber or similar inorganic filler.

The resin for injection molding may be dipped in a solder bath as needed for connection as circuit module. Therefore, thermoplastic resins having a high heat resistance and a higher heat deflection temperature than 200° C. may be employed as the resin for injection molding. Examples of such thermoplastic resins include polyphenylene sulfide (PPS), polyether sulfone (PES), polyetherimide (PEI), polysulfone (PSF), polyethylene terephthalate (PET), polyether etherketone (PEEK), polyamide (PA), polyoxymethylene (POM), acrylonitrilebutadiene styrene (ABS), and all-aromatic polyester. The PET, PA, POM, and ABS of the above-mentioned thermoplastic resins are engineering plastics, and the other resins are super engineering plastics.

If the shape of the transmission circuit structure is comparatively simple, it can be molded in any of the methods, such as usual casting method, transfer molding method, injection molding method, and reactive injection molding method.

The circuit structure according to the present invention has substantially only the electric and/or optical signal transmission medium and the electric power transmission medium insert-molded to integrate in plastics. Electronic component parts other than the transmission media having connection terminals as necessary are mounted on the circuit structure.

The optical fiber can transmit an optical signal and the signal wire and the lead frame of thin metal plate can transmit an electric signal, and they provide circuit functions including transmission and/or reception of control and detecting optical or electric signals. The metal conductive circuit comprising the electric power wire and/or lead frame of thick metal plate provides a function of transmission of electric power.

The two-dimensional or three-dimensional conductive circuit structure can be formed in a way that a combination of one kind and any two kinds of transmission media, or a group of three kinds of the transmission media mentioned above are molded in plastics at the same time.

As described above, the conductive circuit module having the transmission media integrated together is a new module that can perform an entire operation, including control, detection, drive, of electronic and electric devices by way of transmission of the signals and electric power. In addition, a plurality of the conductive circuit modules can be connected with each other through the connection terminals or each of them can be connected to a printed circuit board or a flexible printed circuit board. These features provide a great advantage that the wiring design of the electronic and electric devices are made at large degrees of freedom.

The circuit structure according to the present invention can be used to produce an electronic unit in a way that integrated circuit, light emitting diodes, capacitors, resistors, oscillators, fluorescent lights, and other similar electronic component parts are mounted therein. Mounting of the electronic component parts on the circuit structure can be made by fitting, pressure bonding, or soldering the connection terminals of the electronic component parts to the circuit structure. It should be noted that the circuit structure has connection terminals for the connection of the external component parts.

In the prior art, wiring designs have been met by individual wiring schemes. However, this involves an inherent complicated lead wire arrangement, an increase of numbers of component parts and process steps, low assembling efficiency, and an increase of unnecessary space. The present invention can solve these problems.

That is, the present invention can solve the problems of the prior art by improving the productivity, improving the space factor, and increasing the design freedom. This provides an outstanding advantage that electronic and electric devices can be miniaturized at while maintaining performance characteristics high.

DETAILED DESCRIPTION

Figure 1A:
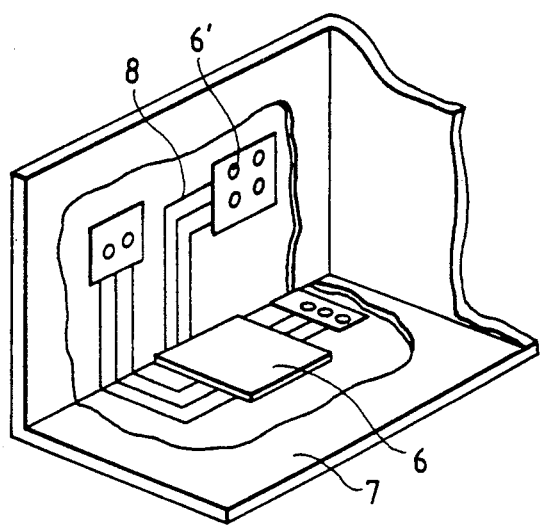
FIG. 1a is a schematic perspective view illustrating the circuit structure in an embodiment of the present invention.

An optical fiber made up of usual inorganic glass or organic high molecular material is used for the optical transmission medium one, two, or three dimensional lead frame obtained by processing a thin plate of metal such as copper system, iron system, aluminum system, or super conductor material, to slit-like shape, or electric wire is used for the transmission of an electric signal. An electric power wire or metal conductive circuit having a rectangular, elliptic, or similar cross-section is used for transmission of electric power.

A high heat resisting thermosetting resin such as an epoxy resin, polyimide resin, phenol resin, unsaturated polyester resin, diallyl phthalate resin, or the like is used for a mold resin. A high heat resisting polyphenylene sulfide (PPS), polyethylene terephthalate (PET), polyether sulfone (PES), polyetherimide (PEI), polysulfone (PSF), polyether etherketone (PEEK), all-aromatic polyester, liquid crystal polymer, or similar single material or its composite material with a inorganic filler, such as silica or glass fiber is used for a thermoplastic resin.

In turn, a molding method is described in detail below. The molding method used in this invention can be any of a casting method, a low pressure injection molding method, and transfer molding method, or a two shot molding method employing an integrated transfer and injection molding machine.

For the purpose of illustration only, the present invention will now be illustrated by the following embodiments. Of course, this invention shall not be limited to the following embodiments.

In describing the preferred embodiment of the invention illustrated in the drawings, specific terminology will be resorted to for the sake of clarity. However, it is not intended to be limited to the specific terms so selected, and it is to be understood that each specific term includes all technical equivalents which operate in a similar manner to accomplish a similar purpose.

EMBODIMENT 1

Figure 3:
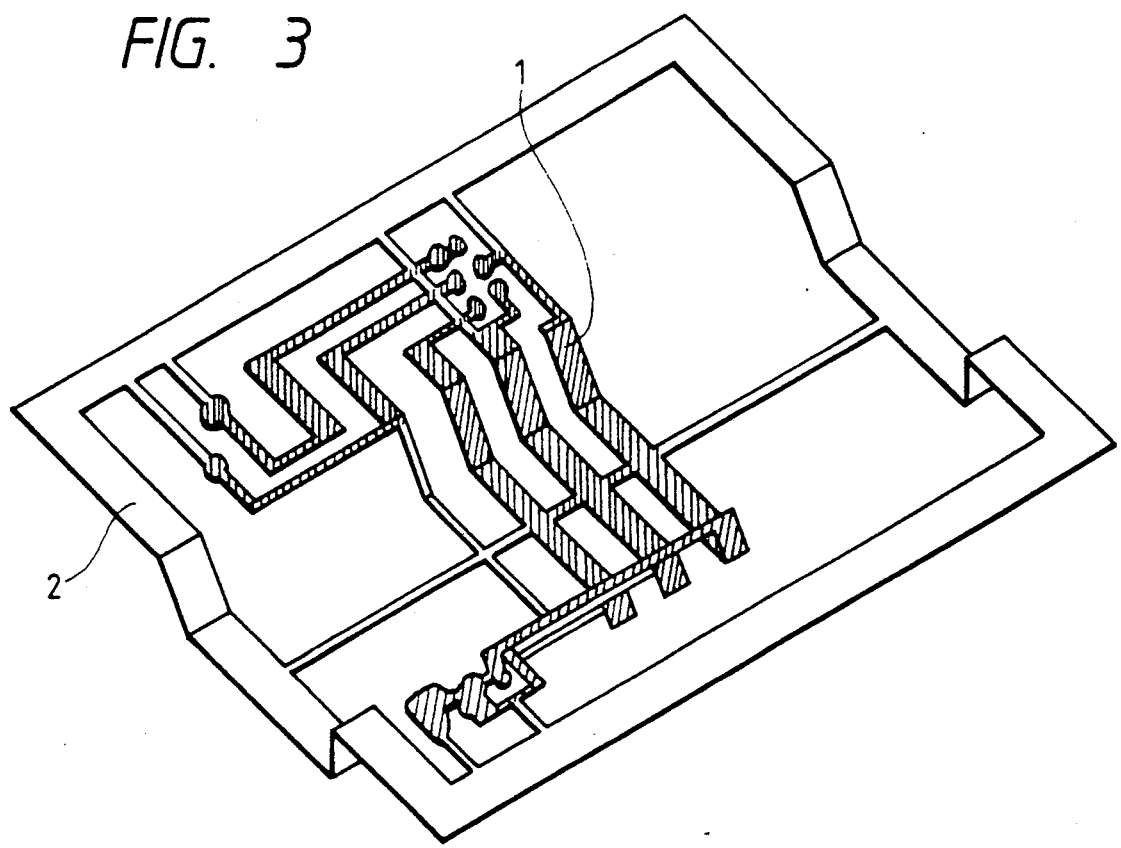
FIG. 3 is a perspective view illustrating the lead frame of thin metal plate for electric signal transmission in an embodiment of the present invention.

In the accompanying drawings, FIG. 3 is a schematic representation of a three-dimensional metal lead frame for transmitting an electric signal. A three-dimensional lead frame 1 of thin metal plate, as shown in FIG. 3, is held by a supporting portion 2 of lead frame. In the figure, the lead frame 1 of thin metal plate is hatched.

Figure 1B:
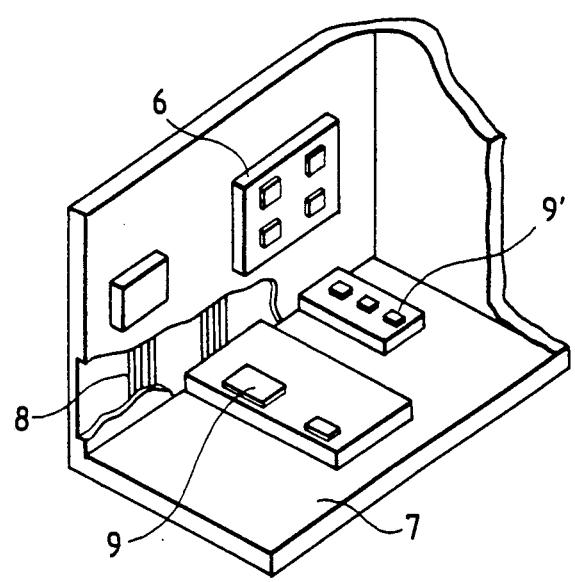
FIG. 1b is a schematic perspective view illustrating the circuit structure of FIG. 1a with electronic component parts mounted therein.
Figure 2A:
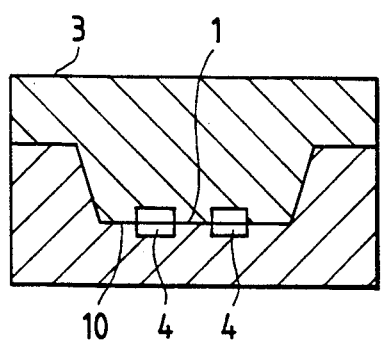
FIG. 2a is a schematic cross-sectional view illustrating the transfer molding process in an embodiment of the present invention.
Figure 2B:
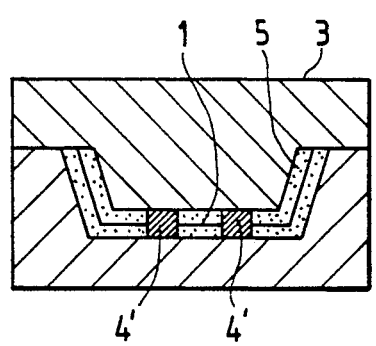
FIG. 2b is a schematic cross-sectional view illustrating the injection molding process in an embodiment of the present invention.

The lead frame 1, as shown in FIG. 2a, is put in a mold cavity portion 4 of a mold 3. Thermosetting resin 4' in FIG. 2b is transfer molded to form a module. Just after this, as shown in FIG. 2b, thermoplastic resin 5 is injection-molded to form a unitary conductive circuit structure shown in FIG. 1a with the slightly opened parts of a parting plane 10 of the mold 3. Parts of the lead frame 1 are put at the parting plane 10 shown in FIG. 2a. FIG. 1b shows the circuit structure shown in FIG. 1a with electronic component parts mounted thereon. In FIGS. 1a and 1b, the reference numeral 6 denotes a conductive circuit module, 6' a connection terminal for the connection of an external electronic component part, 7 a plastic housing, 8 a conductive circuit, 9 an electronic component part like a integrated circuit, and 9' a electronic component part like a capacitor.

Figure 4:
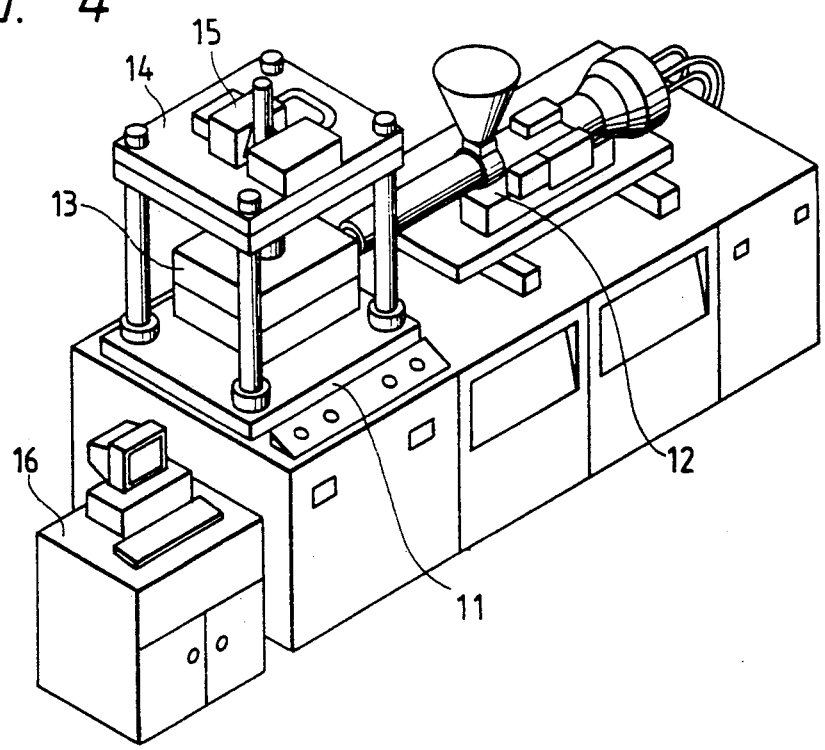
FIG. 4 is a perspective view illustrating a molding machine which can integrate the transfer and injection moldings in forming the circuit structure according to the present invention.

A molding machine such as shown in FIG. 4 is used as an integrated transfer and injection molding machine formed for use in the present invention. In FIG. 4, the integrated transfer and injection molding machine comprises a transfer molding unit 11, an injection molding unit 12, a mold 13, a mold clamp unit 14, a tablet heating device 15, and a control display system 16.

The molding process is featured in that the electric and/or optical transmission medium put in the mold can be molded without any deformation since the melted resin can be transferred at a low pressure of 3 to 9 MPa in the transfer molding. An injection molding as a second stage is to be made for forming a two-dimensional or three-dimensional structure at a pressure of 0.8 to 50 times that of the transfer molding. This structure can mount different external component parts such as electronic component parts therein. It is featured in that the resin employed for the injection molding is able to resist a heat of at least 200° C. or higher for dipping the connection parts in a solder bath. The electronic component parts are mounted in a circuit structure in a way that they are connected to the transmission medium thereof by pressure bonding, dipping in a solder bath, fitting or the like.

Embodiment 2

An optical fiber and lead frame of thin metal plate are used as the optical and electric transmission media respectively; a metal conductor is used as the powder transmission circuit. These are put in the mold.

A glass fiber is used for the optical fiber; a copper plate of 0.15 mm thickness is used for the lead frame of thin metal plate. A copper plate of 1.2 mm thickness is used for the power transmission metal conductor.

Figure 5:
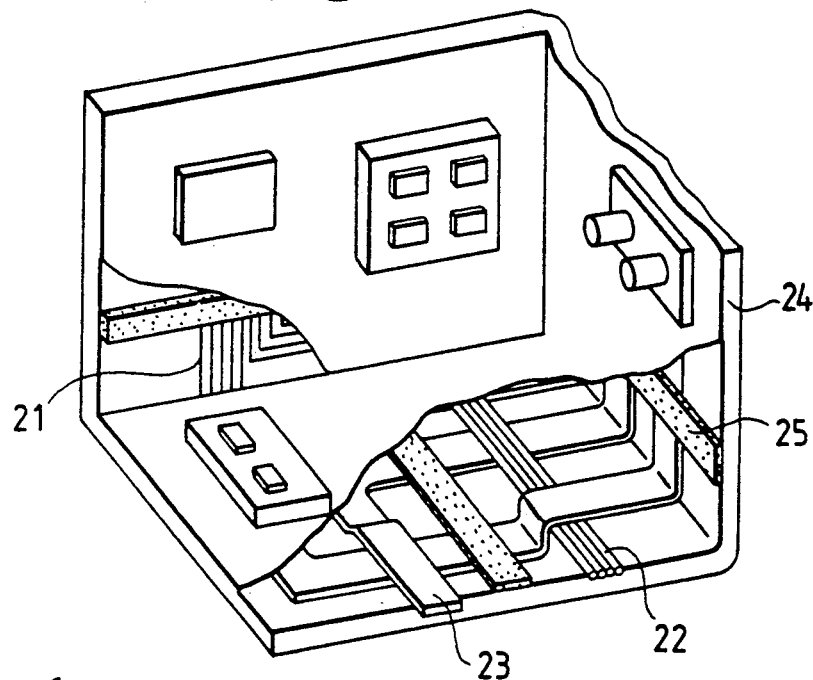
FIG. 5 is a schematic perspective view illustrating the circuit structure of another embodiment of the present invention.

In turn, using the integrated transfer and injection molding machine shown in FIG. 4, molding is made in a way similar to that of Embodiment 1 described previously to obtain a unitary transmission circuit module as shown in FIG. 5.

In FIG. 5, the unitary transmission circuit module comprises a lead frame 21 of thin metal plate which is a transmission circuit for electric signals, an optical fiber 22 which is a transmission circuit for optical signals, a metal conductor 23 which is a transmission circuit for electric power, a plastic housing 24 of approximately .3 mm thick which is an injection-molded part, and a plastic supporter 25 which is a transfer-molded part.

The resins used are epoxy resin mixed with approximately 60 wt % of quartz powder of approximately 80 μm size for the transfer molding and polyphenylene sulfide (PPS) for the injection molding.

The unitary transmission circuit module provides a function of the transmission of the optical signals and electric signals as well as a function of the transmission of the electric power.

These electric and optical transmission functions have been heretofore provided by individual electric wire and optical fiber. The present invention can integrate those functions into one electric and optical transmission circuit module.

Embodiment 3

The present invention is further illustrated in detail by the following embodiment in comparison with a prior art product.

Figure 6:
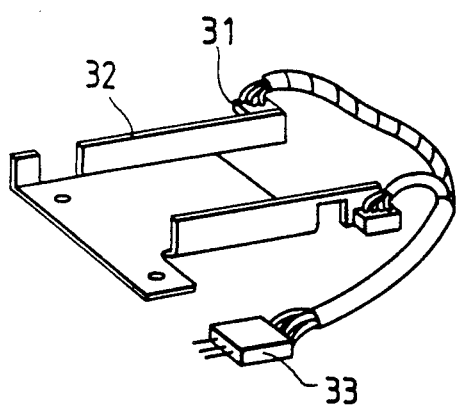
FIG. 6 is a perspective view illustrating a photosensor assembly according to a prior art embodiment.

FIG. 6 shows a prior art photosensor assembly which can detect the paper feed of a printer for use in office automation. A photosensor 31 is mounted on a bracket 32 and is connected to a connector 33 through a wire bundle of conventional electric wires. As this photosensor assembly uses the wire bundle, it is not efficiently assembled, resulting in a decrease of productivity.

Figure 7:
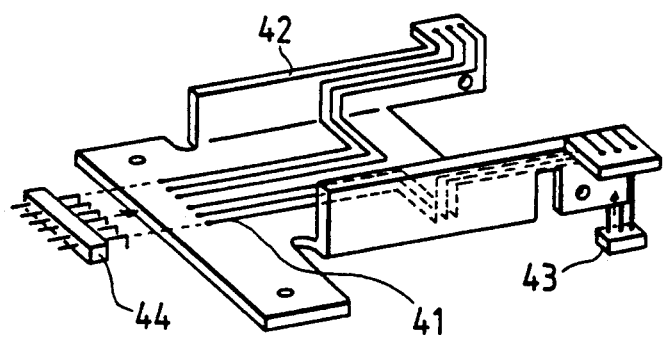
FIG. 7 is a schematic perspective view illustrating a three-dimensional circuit structure for a photosensor in a further embodiment of the present invention.

FIG. 7 shows a three-dimensional conductive circuit module which is molded according to the present invention. A conductive circuit 41 of metal lead frame is inserted or buried in a molded part. The conductive circuit 41 of metal lead frame serves a similar purpose as the wire bundle of the prior art of FIG. 6. Electrical connection of a photosensor 43 is made by soldering or pressure bonding. The three-dimensional circuit module can function with connection of an electronic or electric circuit(s) by insertion of a connector 44.

The following describes how to form the three-dimensional conductive circuit module. In the transfer molding as the first stage, for the electric signal conductive circuit, a thin copper system plate of 0.1 mm thick is subjected to an etching process to form a slit-form conductor 41 in the usual way, and the conductor 41 is properly bent to form a three-dimensional lead frame. The three-dimensional lead frame is put in a mold. Transfer molding is made with the epoxy resin mixed with silica fiber as in Embodiment 2 using the integrated transfer and injection molding machine shown in FIG. 4.

In the injection molding as the second stage, the injection molding is made to form the three-dimensional conductive circuit module having an injection molded plate of 2 mm thickness as shown in FIG. 7.

The module having the photosensor soldered is subjected to a reliability test given in Table 1. After the test, it is guaranteed that it has no problem. In the reliability test, the module which has no deterioration in its drive performance is accepted.

TABLE 1

| ITEM | TEST CONDITION | RESULT |
|---|---|---|
| Moisture resistance | 80° C., 95% RH, 1,000 hours, 5 V, 8 to 30 mA, continuous live | Accepted |
| Thermal | 125° C., 30 min to and fro −55° C., | Accepted |

TABLE 1-continued

| ITEM | TEST CONDITION | RESULT |
| --- | --- | --- |
| shock test | 30 min, 300 cycles | |
| Vibration resistance | 3 G, 2 hours, in the directions of up and down, side to side, and back and forth, 10 to 50 Hz, continuous live | Accepted |
| Heat resistance for soldering | 260 ± 5° C., 5 sec As per JIS C 5012 | Accepted |
| Mixed gas resistance | $H_2S$, $NO_2$, $SO_2$ gas atmosphere of approx. 60 ppm concentration in air, 48 hours | Accepted |

As a result, the present invention can dissolve a problem that a number of component parts is too great, which leads to low productivity. In other words, it accomplishes an increase of economic efficiency due to simplified wiring and improved productivity.

With the three-dimensional conductive circuit structure integrated in resin that can transmit the optical signals, electric signals, and electric power, the present invention provides great economic effects, including reduction of the number of component parts, reduction of assembling steps, and improvement of productivity. In addition, the present invention accomplishes the high performance and the miniaturization of such an electronic and electric device due to the increases of space factor, reliability, and design freedom.

It is to be understood that the form of the invention herewith shown and described is to be taken as a preferred embodiment. Various changes may be made in the shape, size and arrangement of parts. For example, equivalent elements may be substituted for those illustrated and described herein, parts may be reversed, and certain features of the invention may be utilized independently of the use of other features, all without departing from the spirit or scope of the invention as defined in the subjoined claims.

While the principles of the invention have been described above in connection with specific embodiments, and particular modifications thereof, it is to be clearly understood that this description is made only by way of example and not as a limitation on the scope of the invention.

What is Claimed Is:

1. A method of manufacturing a circuit structure comprising the steps of:
   disposing a transmission medium of a two or three-dimensional shape having at least one type of media in a mold;
   molding said transmission medium employing a first polymer at a low pressure to thereby fix or insulation-cover said transmission medium; and
   molding said fixed or insulation-covered transmission medium employing a second polymer at a high pressure under a broadened cavity to thereby obtain a structure uniting said transmission medium.

2. A method of manufacturing a circuit structure as set forth in claim 1, wherein:
   said first polymer is a thermosetting resin and;
   said second polymer is a thermoplastic resin.

3. A method of manufacturing a circuit structure as set forth in Claim 1 wherein:
   said molding at a low pressure is a transfer molding; and
   said molding at a high pressure is an injection molding.

4. A method of manufacturing a circuit structure as set forth in Claim 1 wherein:
   said molding at a low pressure is conducted at a pressure of 3 to 9 MPa; and
   said molding at a high pressure is conducted at a pressure of 0.8 to 50 times that of said molding at low pressure.

5. A method of manufacturing a circuit structure as set forth in claim 1, wherein said at least one type of media includes one or more of an optical signal transmission medium, an electric signal transmission medium, and an electric power transmission medium.

6. A method of manufacturing a circuit structure comprising the steps of:
   disposing a transmission medium of a two or three-dimensional shape having at least one type of media in a mold;
   molding said transmission medium employing a first polymer at a low pressure to thereby fix or insulation-cover said transmission medium; and
   molding said fixed or insulation-covered transmission medium employing a second polymer at a high pressure under a broadened cavity to thereby obtain a structure uniting said transmission medium;
   wherein said first polymer is a thermosetting resin selected from the group consisting of single substances and filler composites of epoxy resin, phenol resin, and diallyl phthalate resin; and
   wherein said second polymer is a thermoplastic resin having heat deflection temperature of more an 200° C. and selected from the group consisting of polyphenylene sulfide (PPS), polyether sulfone (PES), polyetherimide (PEI), polysulfone (PSF), polyethylene terephthalate (PET), polyether etherketone (PEEK), and all-aromatic polyester.

7. A method of manufacturing a circuit structure comprising the steps of:
   disposing a transmission medium of a two or three-dimensional shape having at least one type of media in a mold;
   molding said transmission medium employing a first polymer at a low pressure to thereby fix or insulation-cover said transmission medium; and
   molding said fixed or insulation-covered transmission medium employing a second polymer at a high pressure under a broadened cavity to thereby obtain a structure uniting said transmission medium;
   wherein said molding at a low pressure is a transfer molding conducted at a pressure of 3 to 9 MPa; and
   wherein said molding at a high pressure is an injection molding conducted at a pressure of 0.8 to 50 times that of said molding at low pressure.

* * * * *

UNITED STATES PATENT AND TRADEMARK OFFICE
CERTIFICATE OF CORRECTION

PATENT NO. : 5,179,601
DATED : 12 January 1993
INVENTOR(S) : Masao GOTOH et al..

It is certified that error appears in the above-indentified patent and that said Letters Patent is hereby corrected as shown below:

| Column | Line | |
|---|---|---|
| 1 | 20 | Change "deuris" to --desires--. |
| 1 | 34 | Delete "There is"; delete ", there" at end of line. |
| 1 | 35 | Delete "is". |
| 1 | 55 | Change "herein after" to --hereinafter--. |
| 2 | 13 | After "used" insert --as--. |
| 3 | 67 | Before "while" delete "at". |
| 3 | 68 | Change "performance characteristics high" to --high performance characteristics--. |
| 4 | 51 | Change "a" to --an--. |
| 4 | 57 | After "and" insert --a--. |

UNITED STATES PATENT AND TRADEMARK OFFICE
CERTIFICATE OF CORRECTION

PATENT NO. : 5,179,601
DATED : 12 January 1993
INVENTOR(S) : Masao GOTOH et al..

It is certified that error appears in the above-indentified patent and that said Letters Patent is hereby corrected as shown below:

| Column | Line | |
|---|---|---|
| 5 | 25 | After "like" change "a" to --an--. |
| 5 | 26 | After "9'" change "a" to --an--. |
| 5 | 56 | Change "powder" to --power--. |
| 7 | 15 | Change "dissolve" to --solve--. |
| 8 | 38 | After "more" change "an" to --than--. |

Signed and Sealed this

Eighth Day of March, 1994

Attest:

BRUCE LEHMAN

Attesting Officer

Commissioner of Patents and Trademarks